US008670241B2

(12) United States Patent
Sherrod et al.

(10) Patent No.: US 8,670,241 B2
(45) Date of Patent: Mar. 11, 2014

(54) BLADE DEVICE ENCLOSURE

(75) Inventors: David W. Sherrod, Tomball, TX (US);
Kevin B. Leigh, Houston, TX (US);
Jonathan E. JamesOu, Houston, TX (US); Kurt A. Manweiler, Tomball, TX (US); Joseph R. Allen, Houston, TX (US); Tuan A. Pham, Sugarland, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1118 days.

(21) Appl. No.: 12/121,613

(22) Filed: May 15, 2008

(65) Prior Publication Data

US 2008/0310097 A1 Dec. 18, 2008

Related U.S. Application Data

(60) Provisional application No. 60/943,696, filed on Jun. 13, 2007.

(51) Int. Cl.
*H05K 7/20* (2006.01)

(52) U.S. Cl.
USPC .......................................... 361/725

(58) Field of Classification Search
USPC .......................................... 361/725
See application file for complete search history.

(56) References Cited

U.S. PATENT DOCUMENTS

| 5,227,954 | A | * | 7/1993 | Twigg .................. 361/679.33 |
| 5,877,938 | A | * | 3/1999 | Hobbs et al. ................ 361/724 |
| 5,995,376 | A | * | 11/1999 | Schultz et al. ............... 361/788 |
| 6,185,110 | B1 | * | 2/2001 | Liu ................................ 361/829 |
| 6,456,498 | B1 | * | 9/2002 | Larson et al. ................ 361/752 |
| 6,552,915 | B2 | * | 4/2003 | Takahashi et al. ........... 361/796 |
| 6,594,150 | B2 | * | 7/2003 | Creason et al. .............. 361/727 |
| 6,628,513 | B1 | * | 9/2003 | Gallagher et al. ....... 361/679.33 |
| 6,643,141 | B2 | * | 11/2003 | Kaetsu et al. ................ 361/797 |
| 6,909,611 | B2 | * | 6/2005 | Smith et al. .................. 361/727 |
| 6,950,895 | B2 | * | 9/2005 | Bottom ......................... 710/301 |
| 6,985,357 | B2 | * | 1/2006 | Cauthron ..................... 361/724 |
| 7,042,736 | B2 | * | 5/2006 | Katakura et al. ............. 361/797 |
| 7,092,253 | B2 | | 8/2006 | Lam |
| 7,106,584 | B2 | * | 9/2006 | Yair et al. ................ 361/679.02 |
| 7,170,753 | B2 | * | 1/2007 | Campini ...................... 361/737 |
| 7,188,205 | B2 | * | 3/2007 | Le et al. ....................... 710/300 |
| 7,209,347 | B2 | * | 4/2007 | Liang et al. .................. 361/752 |
| 7,245,632 | B2 | * | 7/2007 | Heffernan et al. ........... 370/465 |
| D560,665 | S | * | 1/2008 | Wang et al. ................. D14/432 |
| 7,619,897 | B2 | * | 11/2009 | Della Fiora et al. ......... 361/724 |
| 2002/0006026 | A1 | * | 1/2002 | Takahashi et al. ........... 361/687 |
| 2003/0097487 | A1 | * | 5/2003 | Rietze et al. ................. 709/325 |
| 2008/0259555 | A1 | * | 10/2008 | Bechtolsheim et al. ...... 361/686 |

* cited by examiner

*Primary Examiner* — Anthony Q Edwards

(57) ABSTRACT

A blade device enclosure has a chassis configured to selectively house a plurality of configurations of full-high and half-high blade devices, an administrator module, and at least one input/output device. The blade device enclosure also has a printed circuit board including a passive high-speed midplane configured to electronically couple the blade devices to the administrator module and the at least one input/output device.

16 Claims, 10 Drawing Sheets

BLADE DEVICE ENCLOSURE

CROSS-REFERENCE TO RELATED APPLICATION

The present application claims priority under 35 U.S.C. §119(e) from previous U.S. provisional Patent Application No. 60/943,696, entitled "Rack Mountable Enclosure for Housing and Efficiently Powering and Cooling Several Server Blades and I/O Switches in Multiple Configuration Combinations" filed Jun. 13, 2007, which provisional application is hereby incorporated by reference in its entirety.

BACKGROUND

Businesses and other organizations dealing with the management of data have generally followed a trend of requiring increasing amounts of computing power and digital storage to organize and process ever-expanding pools of data. Not surprisingly, many of these organizations dealing with high volumes of digital data processing have expressed a need for high-powered, economical computing devices that can be adapted to perform specific tasks and that are hot-swappable in case of failure.

These needs have led to the emergence of new technology relating to the aggregation and storage of multiple computing devices. One development that has become particularly popular in recent years is that of the blade device. A blade device is a self-contained computing device designed for a specific data processing task, such as high-density data storage. Typically, a blade device includes at least one or more processors and electronic memory mounted on a single, hot swappable board. Power, cooling, networking, and access to peripheral devices (e.g. hard drives, etc.) are typically provided to the blade device by a blade enclosure designed to house multiple blade devices. The blade device enclosure may also house power supplies, cooling devices, electrical power connections, data interconnections, and peripheral I/O devices that communicate with the blade devices.

Early generations of blade devices and corresponding enclosures solved some data center problems by increasing density and reducing cable count. However, they also introduced other issues. For example, typical blade device enclosures do not provide much flexibility in the configuration or size of blade devices that the enclosures are designed to accommodate. Furthermore, data interconnections provided by blade device enclosures to the blade devices may be inefficient and/or of a slower than an optimal data rate for a particular blade device.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1:
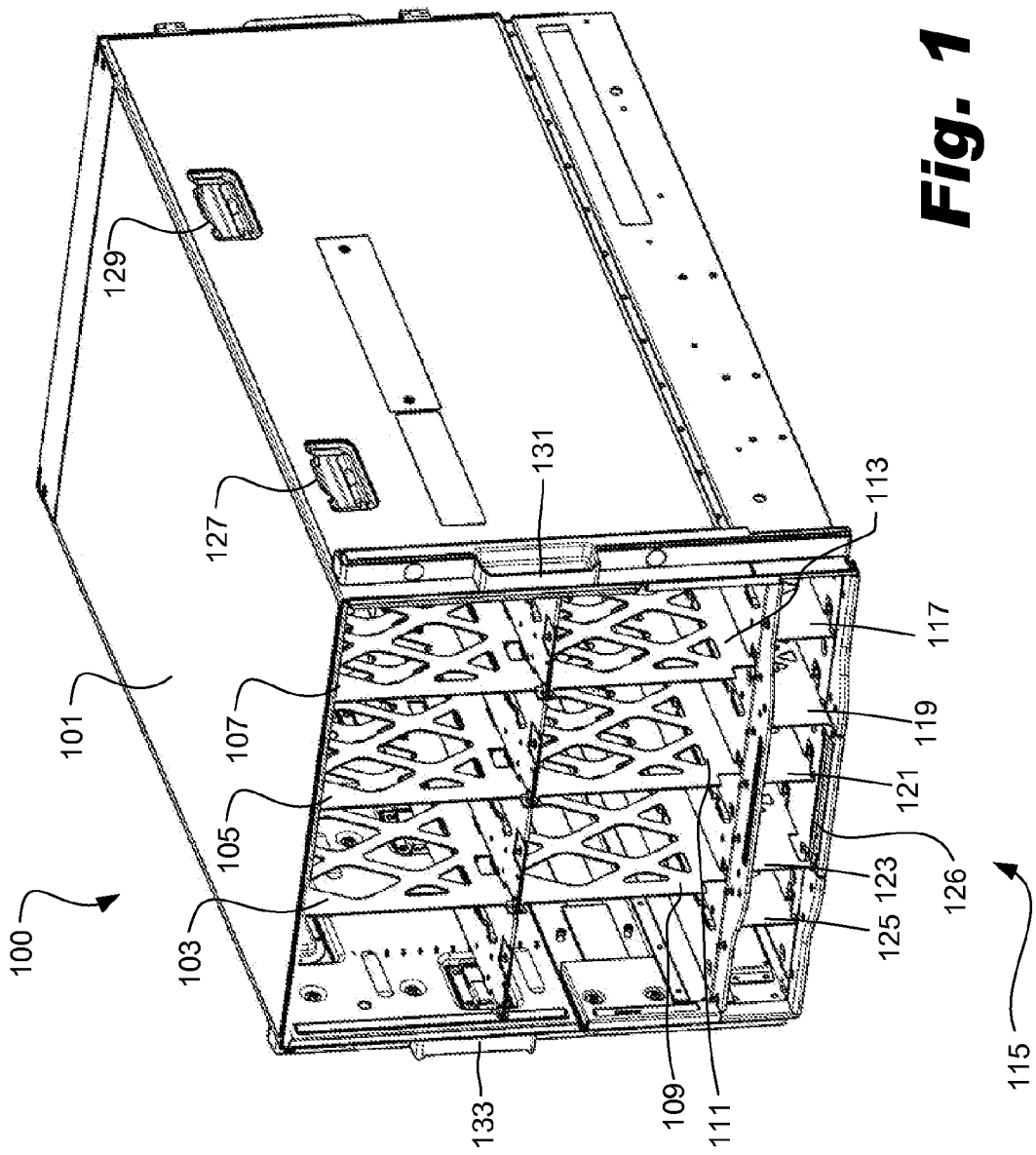
FIG. 1 illustrates a perspective front view of an illustrative empty blade device enclosure according to one embodiment of the principles described herein.

As mentioned above, blade device enclosures may be used to house blade devices and provide the devices with power, cooling, and data interconnections. However, typical blade device enclosures typically provide no flexibility in the configuration or size of the blade devices that the enclosure is designed to accommodate. Furthermore, data interconnections provided by typical blade device enclosures may be inefficient or slower than desired.

To address these and other issues, the present specification discloses a blade device enclosure that can be configured to house multiple configurations of both full and half-high blade devices. The blade device enclosure described herein may also be configured to house at least one administrator module and at least one input/output device. Additionally, the blade device enclosure described herein may include a printed circuit board having a passive high-speed midplane configured to electronically couple the blade devices to the administrator module and the at least one input/output device.

As used in the present specification and in the appended claims, the term "blade device" refers to a self-contained computing device on at least one single, mountable board. Blade devices as thus defined may include, but are not limited to, processing devices, data storage devices, and input/output expansion devices.

As used in the present specification and in the appended claims, the term "blade device enclosure" refers to a housing for one or more blade devices, where the housing is configured to provide at least electrical power and data interconnections to the one or more blade devices accommodated therein.

As used in the present specification and in the appended claims, the term "hot-swap" or "hot-swappable" refers to the act or ability of remove and replace components in a blade device enclosure quickly without excessive reconfiguration or shutdown of other components or operations of a system housed and managed by the blade device enclosure.

As used in the present specification and in the appended claims, many of the functional units described in the present specification have been labeled as "modules" in order to more particularly emphasize their implementation independence. For example, modules may be implemented in software for execution by various types of processors. An identified module or module of executable code may, for instance, include one or more physical or logical blocks of computer instructions that may, for instance, be organized as an object, procedure, or function. Nevertheless, the executables of an identified module need not be physically located together, but may include disparate instructions stored in different locations which, when joined logically together, collectively form the subsystem and achieve the stated purpose for the subsystem. For example, a subsystem of executable code could be a single instruction, or many instructions, and may even be distributed over several different code segments, among different programs, and across several memory devices. In other examples, subsystems may be implemented entirely in hardware, or in a combination of hardware and software.

In the following description, for purposes of explanation, numerous specific details are set forth in order to provide a thorough understanding of the present systems and methods. It will be apparent, however, to one skilled in the art that the present systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

The principles disclosed herein will now be discussed with respect to illustrative systems and methods.

Illustrative Systems

Referring now to FIG. 1, a front view of an illustrative blade device enclosure (100) is shown. The blade device enclosure (100) may be configured to house and power hot-swappable blade devices, power supplies, input/output (I/O) devices, cooling devices, administration modules, and other hot-swappable devices. However, for purposes of illustration, in the present figure, the illustrative blade device enclosure (100) is shown without any of these devices.

Blade devices used with the illustrative blade device enclosure (100) may be manufactured according to full or half-high specifications. Typically, both full and half-high blade devices will have the same width and depth dimensions, with full-high blade devices having double the height dimension of a corresponding half-high blade device. Manufacturers and consumers of blade devices may require different heights of blade devices, e.g., full-high or half-high, according to the components on the blade devices and the individual needs of the data systems in which the blade devices will be used.

In the present embodiment, the illustrative blade device enclosure (100) is shown configured to house only half-high blade devices. However, the illustrative blade device enclosure (100) may be reconfigured to accommodate full-high blade devices or a combination of half-high and full-high blade devices, as will be explained and demonstrated in more detail below. Thus, the versatility of the illustrative blade device enclosure (100) may enable it to adapt as the needs of the data system change The blade device enclosure (100) may include a chassis (101) that defines an internal volume. In certain embodiments, the chassis (101) may be at least partially metallic to provide strength and electromagnetic isolation to the electronic components housed therein. In other embodiments, any material of sufficient strength may be used in accordance with the characteristics of a particular application of the principles described herein.

Vertical partitioning walls (103, 105, 107, 109, 111, 113) may be disposed within a portion of the internal volume of the blade device enclosure (100) to define separate blade device zones. Each of the blade device zones may be configured to accommodate two half-high blade devices disposed beside each other. Thus, in the present configuration, the blade device enclosure (100) of the present example may be equipped to house 16 half-high blade devices, with eight of the blade devices being disposed in the upper four blade device zones and a remaining eight of the blade devices being disposed in the lower four blade device zones as seen in FIG. 1.

Under the present configuration, each of the blade device zones may have a height approximately equal to the height of the half-high blade devices and a width approximately equal to the width of two blade devices in order to comfortably house two half-high blade devices. In certain embodiments, additional mounting hardware may be present on inner walls of the chassis (101) and/or the partitioning walls (103, 105, 107, 109, 111, 113) to secure the blade devices within respective blade device zones. In addition to the partitioning walls (103, 105, 107, 109, 111, 113), the interior of the blade device enclosure (100) may be divided using rails on the ceilings and floors of the enclosure (100) and/or any other dividing features that may suit a particular application of the principles described herein.

Blade devices may be installed or removed from the blade device enclosure (100) by simply inserting the blade devices through the front side (115) of the blade device enclosure (100) into a desired slot within one of the eight blade device zones formed by the partitioning walls (103, 105, 107, 109, 111, 113). When a blade device is installed in the blade device enclosure (100), corresponding electrical interconnections on the blade device and within the blade device enclosure (100) will be mated. These electrical interconnections may provide each blade device with electrical power and communication with other devices housed by the blade device enclosure (100) and/or devices external to the enclosure (100). Additionally, connections to external networks may be routed to the blade devices through the enclosure's electrical interconnections. The electrical interconnections provided to each blade device may be electrically coupled to a printed circuit board within the blade device enclosure (100) that has a passive high-speed midplane, as explained in more detail below.

In certain embodiments, the electrical interconnections may include mating electrical hardware that route multiple signals to and from multiple nodes in the blade device. In other embodiments, individual customized electrical connections may be selected and configured between nodes in the electrical interconnections of the blade device enclosure (100) and those of the blade device.

The illustrative blade device enclosure (100) may also include additional partitioning walls (117, 119, 121, 123, 125) within the inner volume of the chassis (101) configured to provide spaces for housing redundant power supplies for the electronic components housed by the blade device enclosure (100). Redundant, hot-swappable power supplies may provide stability and increased powering capabilities to the blade device enclosure (100).

Another mounting space (126) may be provided to accommodate a user interface display, such as a touchscreen module. Consequently, a user interface including a display screen is accessible to the user. The user interface display may provide basic operating information to the user of the blade device enclosure (100) and may be configured to receive simple commands or queries from a user that may be routed to an administration module of the enclosure (100). Additionally, the mounting space (126) may be configured to allow the user interface display to slide axially to the left or right to provide access to the adjacent power supply housing spaces during installation and/or removal of a power supply.

The illustrative blade device enclosure (100) may include handles (127, 129, 131, 133) mounted to the chassis (101) to assist a user transporting or positioning the blade device enclosure (100) according to space needs or desires of a particular user. In certain embodiments, the blade device enclosure (100) may include caster wheels or the like mounted on the bottom of the chassis (101) to provide mobility to the enclosure (100). In additional embodiments, rubber, plastic, or polymer feet may be attached to the bottom of the chassis (101) to secure the enclosure (100) and prevent damage to or from underlying surfaces. Additionally or alternatively, mounting hardware may be included on the exterior of the chassis (101) for mounting the enclosure (100) to a rack or otherwise securing the enclosure (100) to a supporting structure. In certain embodiments, the blade device enclosure (100) may be mounted with casters (not shown) and thus be configured for upright orientation or sideways rotation according to the specifications of a particular application.

Figure 2:
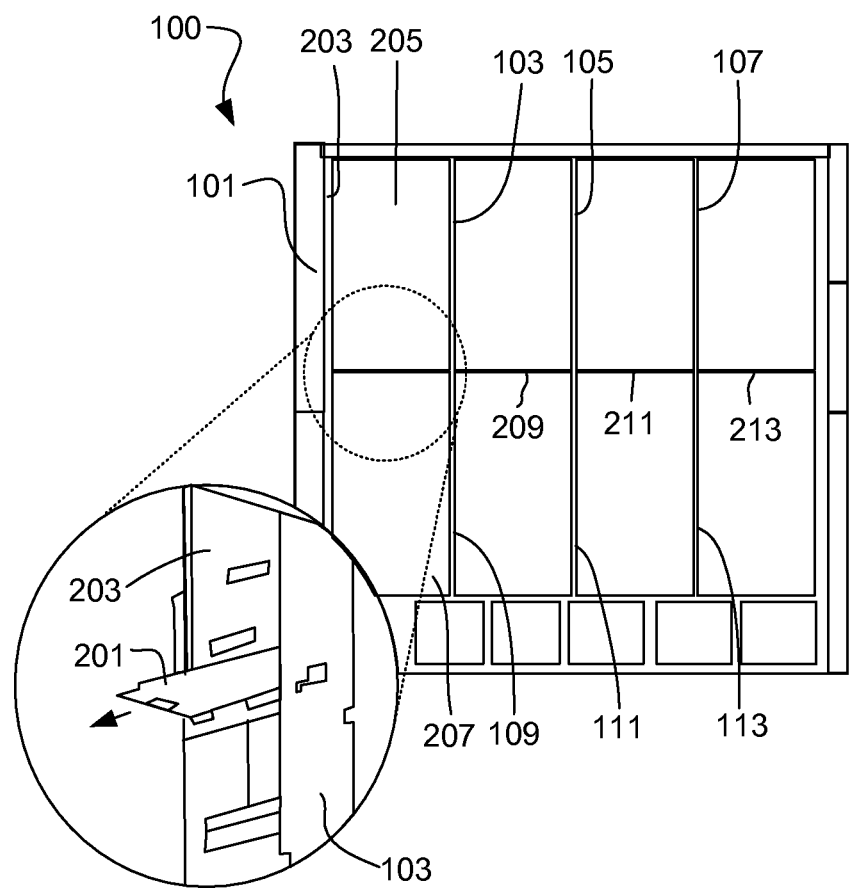
FIG. 2 is a diagram of an illustrative removable divider that may be used with a blade device enclosure according to one embodiment of the principles described herein.

Referring now to FIG. 2, a front view of the illustrative blade device enclosure (100) of FIG. 1 is shown with a removable partitioning wall (201) being removed from between an inner wall (203) of the chassis (101) and a second of the partitioning walls (103). The removable partitioning wall (201) may be configured to be selectively removed and inserted as may best suit a particular application of the principles described herein. In certain embodiments, mating hardware may be present on the removable partitioning wall (201), the inner wall (203) of the chassis (101), and/or the second partitioning wall (103), respectively, to secure the removable partitioning wall (201) to the inner wall (203) and to another of the partitioning wall (103) in addition to facilitating the selective insertion and removal of the removable partitioning wall (201).

When the removable partitioning wall (201) is removed, the blade device zones (205, 207) immediately above and below the removable partitioning wall (201) may be merged into a single blade device zone having twice the height of the previous blade device zones (205, 207). This newly created blade device zone may be of the correct size to house two full-high blade devices or one full-high, double-wide blade device.

Additional removable partitioning walls (209, 211, 213) may be disposed between individual partitioning walls (103, 105, 107). These removable partitioning walls (201, 209, 211, 213) may also be selectively removable to merge half-high blade device zones into full-high blade device zones configured to house full-high blade devices. In embodiments where only full-high blade devices are to be housed by the enclosure (100), each of the removable partitioning walls (201, 209, 211, 213) may be removed. In other embodiments, some of the removable partitioning walls (201, 209, 211, 213) may be removed while other of the removable partitioning walls (201, 209, 211, 213) may be left in place to accommodate systems incorporating a combination of half-high and full-high blade devices.

Figure 3:
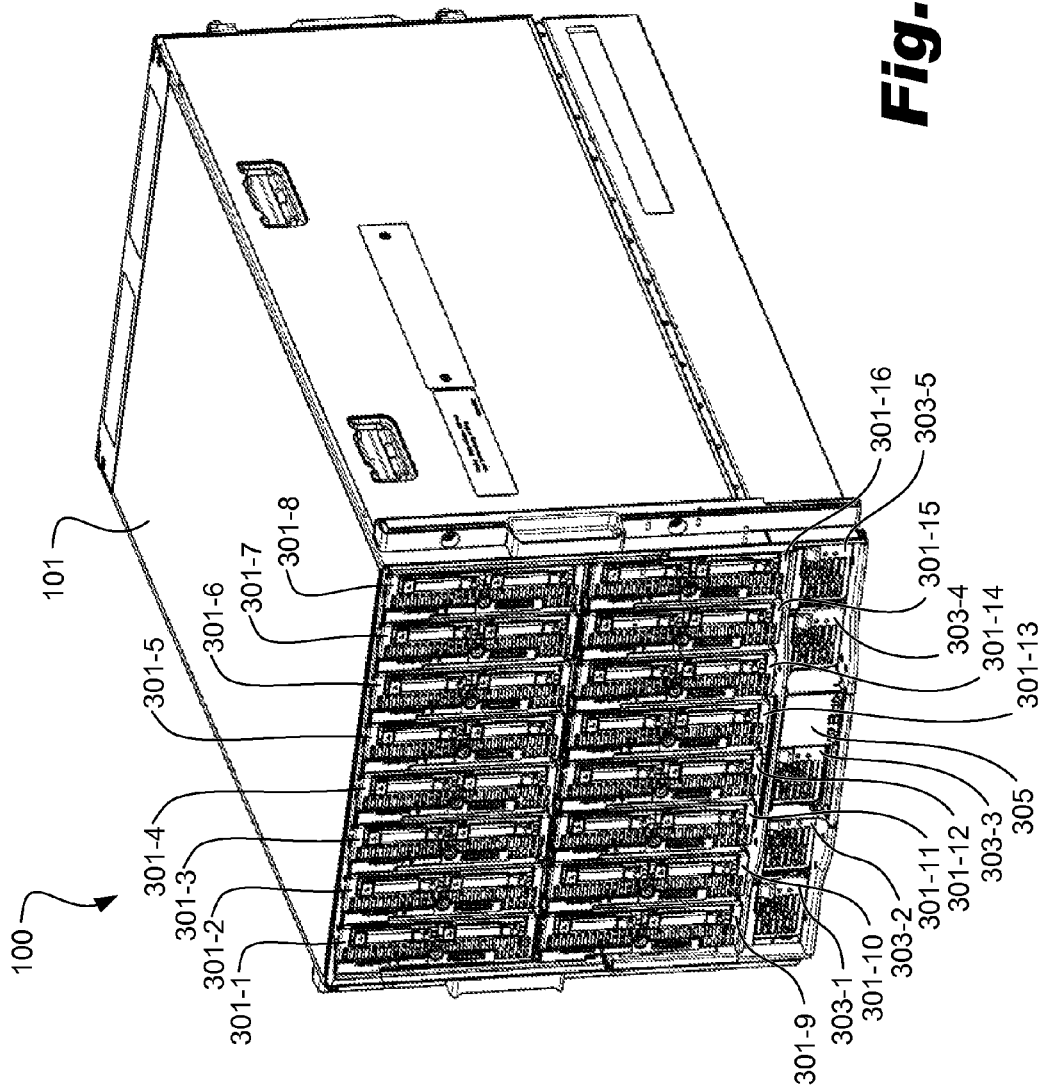
FIG. 3 illustrates a perspective front view of an illustrative blade device enclosure populated with blade devices according to one embodiment of the principles described herein.

Referring now to FIG. 3, the illustrative blade enclosure (100) is shown populated entirely with half-high blade devices (301-1 to 301-16). Each of the removable partitioning walls (201, 209, 211, 213, FIG. 2) have been left in the enclosure (100) of the present example to create eight zones, with each zone configured to house two half-high blade devices (301-1 to 301-16) side-by-side, as described in relation to FIG. 1.

In the present example, the illustrative blade device enclosure (100) is also shown populated with redundant power supplies (303-1 to 303-5) that may be configured to receive electric power from an external source and convert the voltage and current type to that used by the blade devices. In certain embodiments, the redundant power supplies (303-1 to 303-5) of the illustrative blade device enclosure (100) may be configured to convert electric power from a plurality of types of external sources, such as 120 VAC power sources, 240 VAC power sources, 3-phase AC power sources, DC power sources, and any other power source that may suit a particular application of the principles described herein.

The illustrative blade enclosure (100) of the present specification provides a significant housing advantage when some of the blade devices (301-1 to 301-16) include key components (e.g. memory modules, heat sinks, etc.) having heights that may cause mechanical interference with a neighboring blade device to the side. The number and configuration of the blade devices (301-1 to 301-16) in the present example may allow the usage of tall electronic and supporting components. Rather than having several thin blade devices arranged only side by side, the present architecture allows taller blades to be arranged over and/or under each other as well as side by side. In cases where particularly tall components are used, neighboring blade device slots may be left empty to provide room for the tall components that extend horizontally in FIG. 3, into that neighboring slot. Additionally, the blade enclosure (100) may be configured to house double-wide blade devices.

Figure 4:
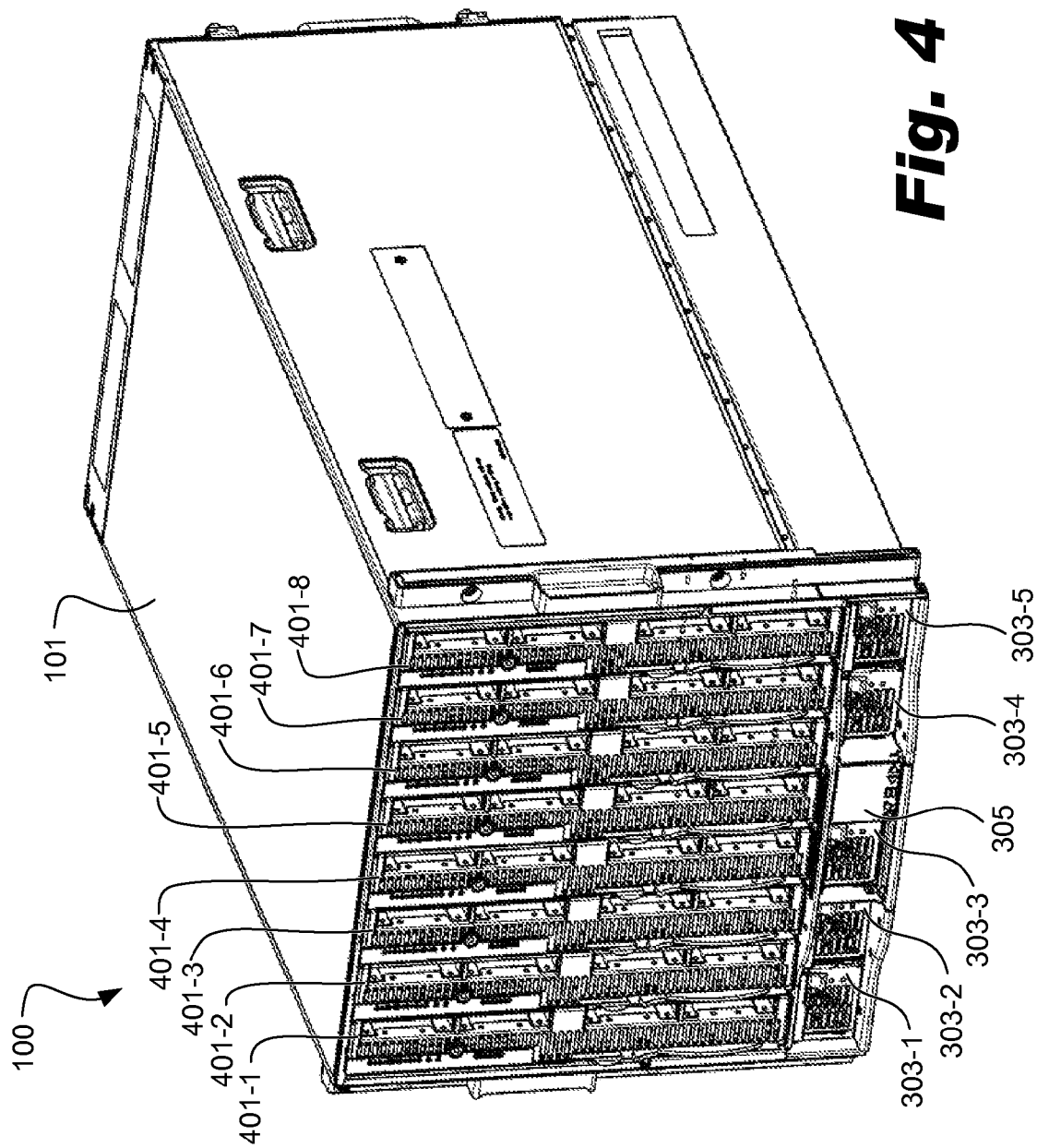
FIG. 4 illustrates a perspective front view of an illustrative blade device enclosure populated with blade devices according to one embodiment of the principles described herein.

Referring now to FIG. 4, the illustrative blade device enclosure (100) is shown populated entirely with full-high blade devices (401-1 to 401-8). To accommodate the full-high blade devices (401-1 to 401-8), each of the removable partitioning walls (201, 209, 211, 213, FIG. 2) of the present example have been removed from the enclosure (100) to create four zones, with each zone configured to house two full-high blade devices (401-1 to 401-8) side-by-side, as shown.

Figure 5:
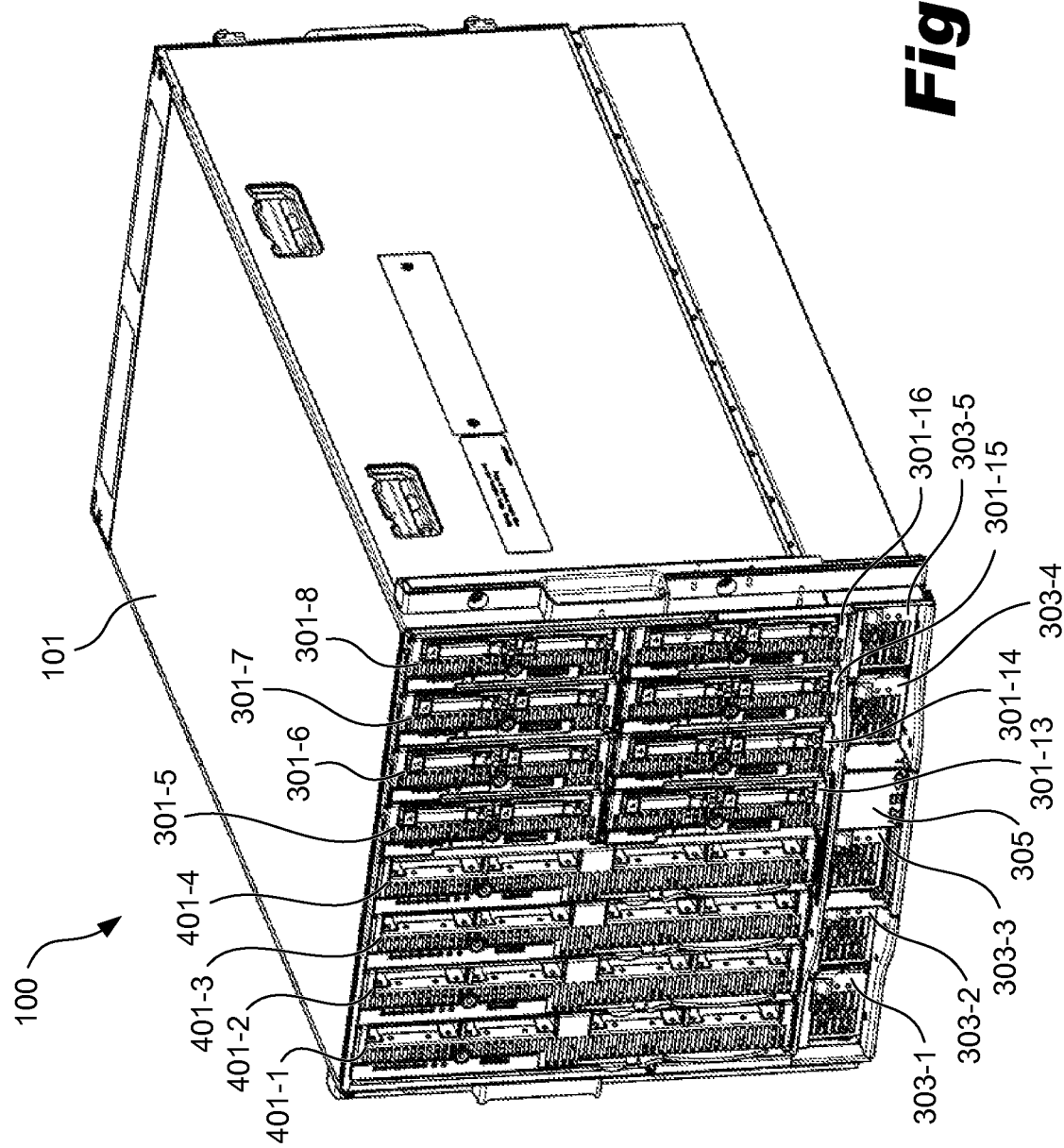
FIG. 5 illustrates a perspective front view of an illustrative blade device enclosure populated with blade devices according to one embodiment of the principles described herein.

Referring now to FIG. 5, the illustrative blade enclosure (100) is shown populated with a combination of full-high blade devices (401-1 to 401-4) and half-high blade devices (301-5 to 301-8 and 301-13 to 301-16). In the present example, two of the removable partitioning walls (211, 213, FIG. 2) may be included in the illustrative blade enclosure (100) to house the half-high blade devices (301-5 to 301-8 and 301-13 to 301-16), while the other two of the removable partitioning walls (201, 209, FIG. 2) may be removed from the enclosure (100) to house the full-high blade devices (401-1 to 401-4).

Figure 6:
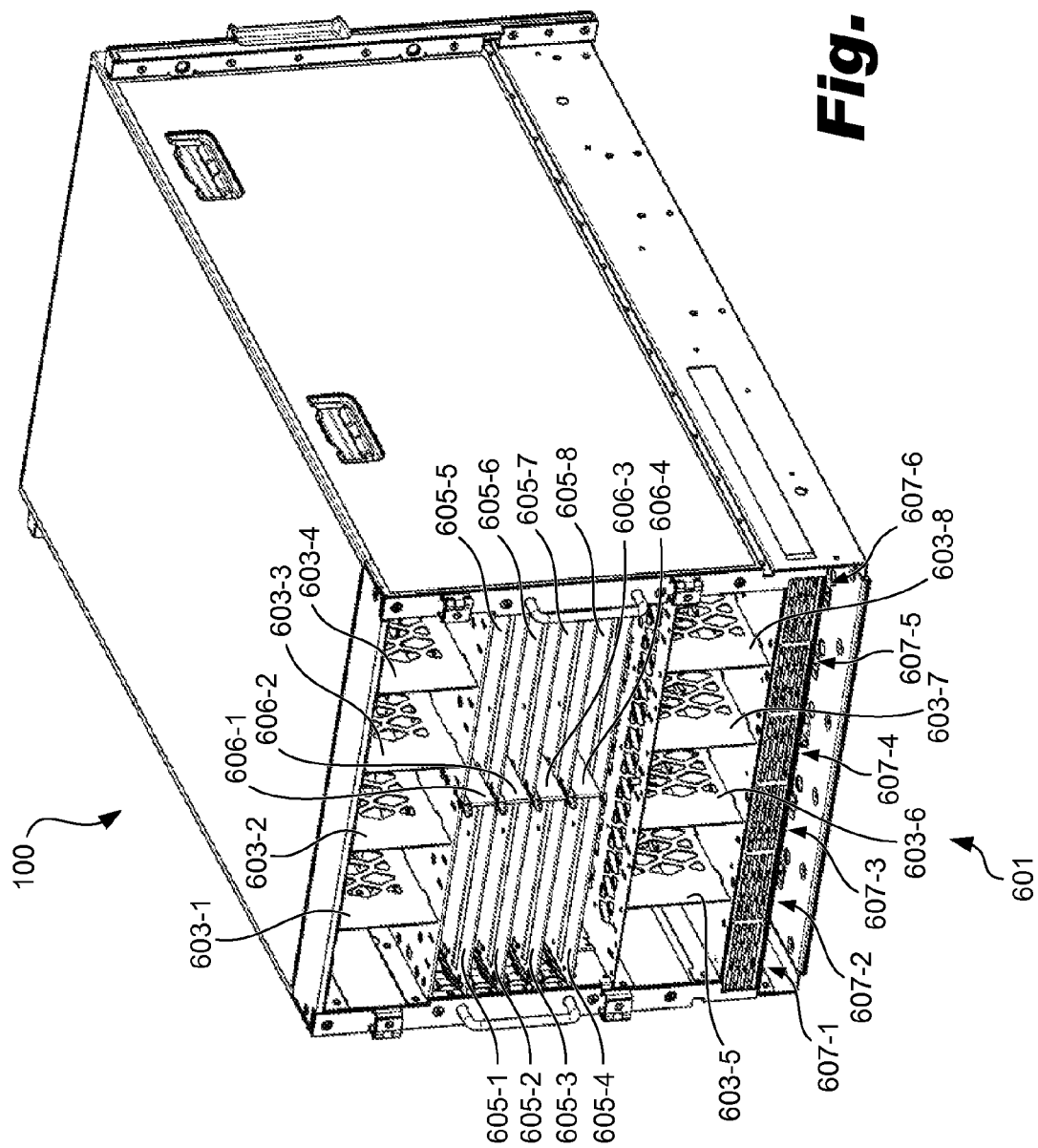
FIG. 6 illustrates a perspective rear view of an illustrative empty blade device enclosure according to one embodiment of the principles described herein.

Referring now to FIG. 6, a rear view of the illustrative blade device enclosure (100) is shown. The rear portion (601) of the blade device enclosure (100) may be configured to house selectively-removable fan devices, input/output devices, and administrator modules. For purposes of illustration, in the present figure the blade device enclosure (100) is shown without any of these devices.

The rear portion (601) of the enclosure (100) may include a plurality of partitioning walls (603-1 to 603-8) configured to providing slots for housing fan devices that may be selectively activated to cool blade devices and other electronic components housed in the enclosure (100). Additional partitioning walls (605-1 to 605-8) may be configured to provide slots for housing input/output devices and at least one administrator module configured to manage communication between various devices in the enclosure (100) and selectively monitor and control power supply and cooling for the blade devices.

Moreover, additional partitioning walls (606-1 to 606-4) may be selectively removed to configure one or more of the slots to house double-wide input/output devices. In certain embodiments, one or more of the partitioning walls (603-1 to 603-8, 605-1 to 605-8, 606-1 to 606-4) used to house the input/output devices, blade devices, and/or fans may be fixed or removable, as may suit a particular application.

Vents (607-1 to 607-6) may provide an exit port for air circulated through the enclosure (100). In particular, the vents (607-1 to 607-6) may direct the circulating air across the power supplies (303-1 to 303-5) to cool heat generated by power conversion.

Figure 7:
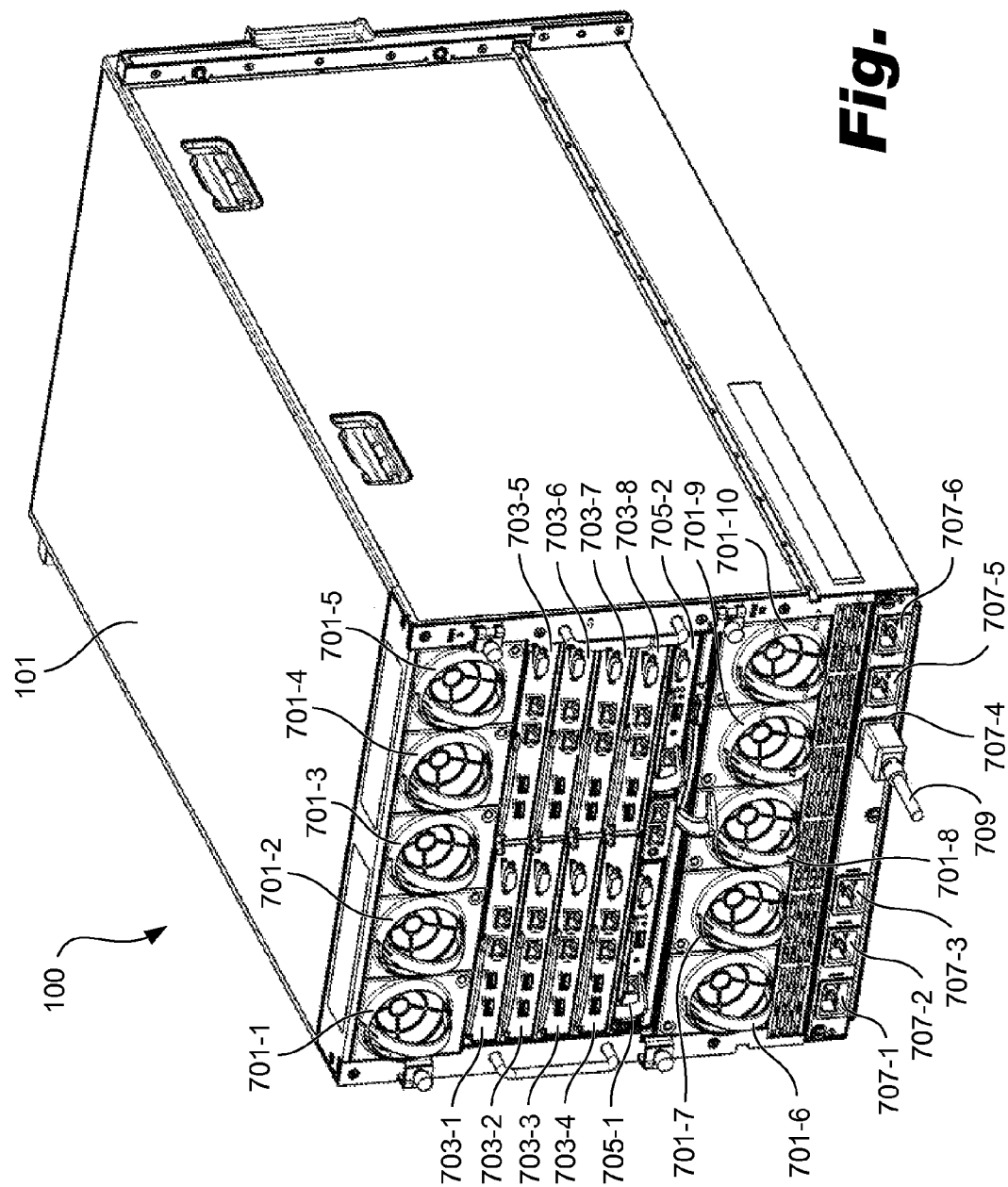
FIG. 7 illustrates a perspective rear view of an illustrative blade device enclosure populated with cooling devices, power supplies, and I/O devices, and management modules, according to one embodiment of the principles described herein.

Referring now to FIG. 7, the rear portion (601) of the illustrative blade device enclosure (100) is shown populated with fans (701-1 to 701-10), input/output modules (703-1 to 703-8), redundant administrator modules (705-1, 705-2) and power input receptacles (707-1 to 707-6).

Each administrator module (705-1, 705-2) may include at least one processor configured to perform instructions stored in memory on the administrator module (705-1, 705-2). The administrator modules (705-1, 705-2) may be configured to communicate with devices in the enclosure (100) in addition to devices external to the enclosure (100). The administrator modules (705-1, 705-2) may connect directly to external devices or networks of devices in certain embodiments to receive additional instructions or data. In other embodiments, the administrator modules (705-1, 705-2) may communicate with external devices or networks through the I/O modules (703-1 to 703-8).

In certain embodiments, the I/O modules (703-1 to 703-8) may be configured to connect to external devices or networks of devices and route signals between the external devices and devices housed in the enclosure (100), such as the blade devices (401-1 to 401-8, FIG. 4). Additionally or alternatively, the I/O modules (703-1 to 703-8) may include local storage, such as hard disk drives or other memory that may be accessed by the blade devices (401-1 to 401-8, FIG. 4). In certain embodiments, the I/O modules may include at least one computing device, such as a processor.

The power input receptacles (707-1 to 707-6) may each be configured to couple to a power cord (709) that provides power from an external power source. In certain embodiments, multiple power cords (709) may be used to power the blade device enclosure (100) for redundancy. In other embodiments, each of the power supplies (303-1 to 303-5) may be configured to couple to a separate cord to operate. In still other embodiments, different types of power input receptacles (707-1 to 707-6) may be used in the enclosure to provide versatility in coupling to different types of power cords (709) and/or different types of external power sources.

Figure 8:
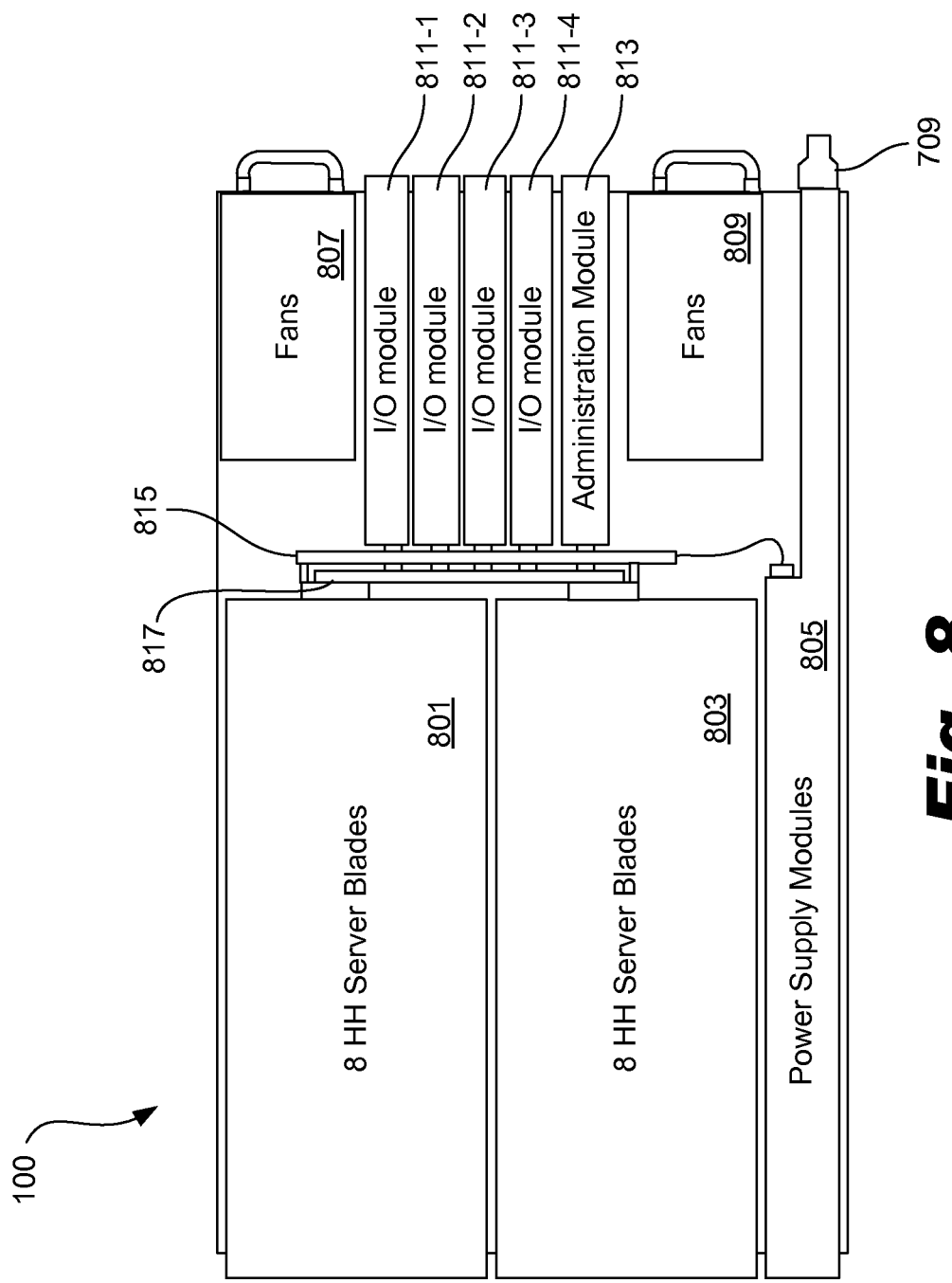
FIG. 8 is a diagram of space usage within an illustrative blade device enclosure, according to one embodiment of the principles described herein.

Referring now to FIG. 8, a side-view diagram of space usage in the illustrative blade device enclosure (100) is shown. In the embodiment shown, the blade device enclosure (100) is configured to house 16 half-high blade devices (301-1 to 301-16, FIG. 3) in top blade zones (801) and bottom blade zones (803) as described in connection with the example shown in FIG. 3. It will be understood that the enclosure (100) may alternatively house up to 8 full-high blade devices (401-1 to 401-8, FIG. 4) or a combination of half-high and full-high blade devices.

A power supply module zone (805) may extend along the bottom of the enclosure (100) and connect to at least one power cord (709). Zones for fans (807, 809), zones for I/O modules (811-1 to 811-4), and zones for administration modules (813) may be disposed along the rear side of the blade device enclosure (100) as explained with respect to FIGS. 6-7.

Power may be provided to the devices in each of the zones (801, 803, 807, 809, 811-1 to 811-4, 813) by one or more conductors in a power interconnection (815) disposed in the middle of the enclosure (100) and coupled to the power supplies (303-1 to 303-5) and to each of the devices requiring electrical power to operate. In certain embodiments, redundant power connections may be provided to one or more of the devices in the enclosure (100) to provide power stability.

Data connections between the devices in the blade zones (801, 803), the I/O module zones (811-1 to 811-4) and the administration module zone (813) may be provided by at least one printed circuit board (817) having a passive high-speed midplane configured to electrically couple blade devices to the administrator module zones (813) and the I/O module zones (811-1 to 811-4). As with the power connections, in certain embodiments the at least one printed circuit board (817) may provide redundant data connections between devices for added stability.

Figure 9:
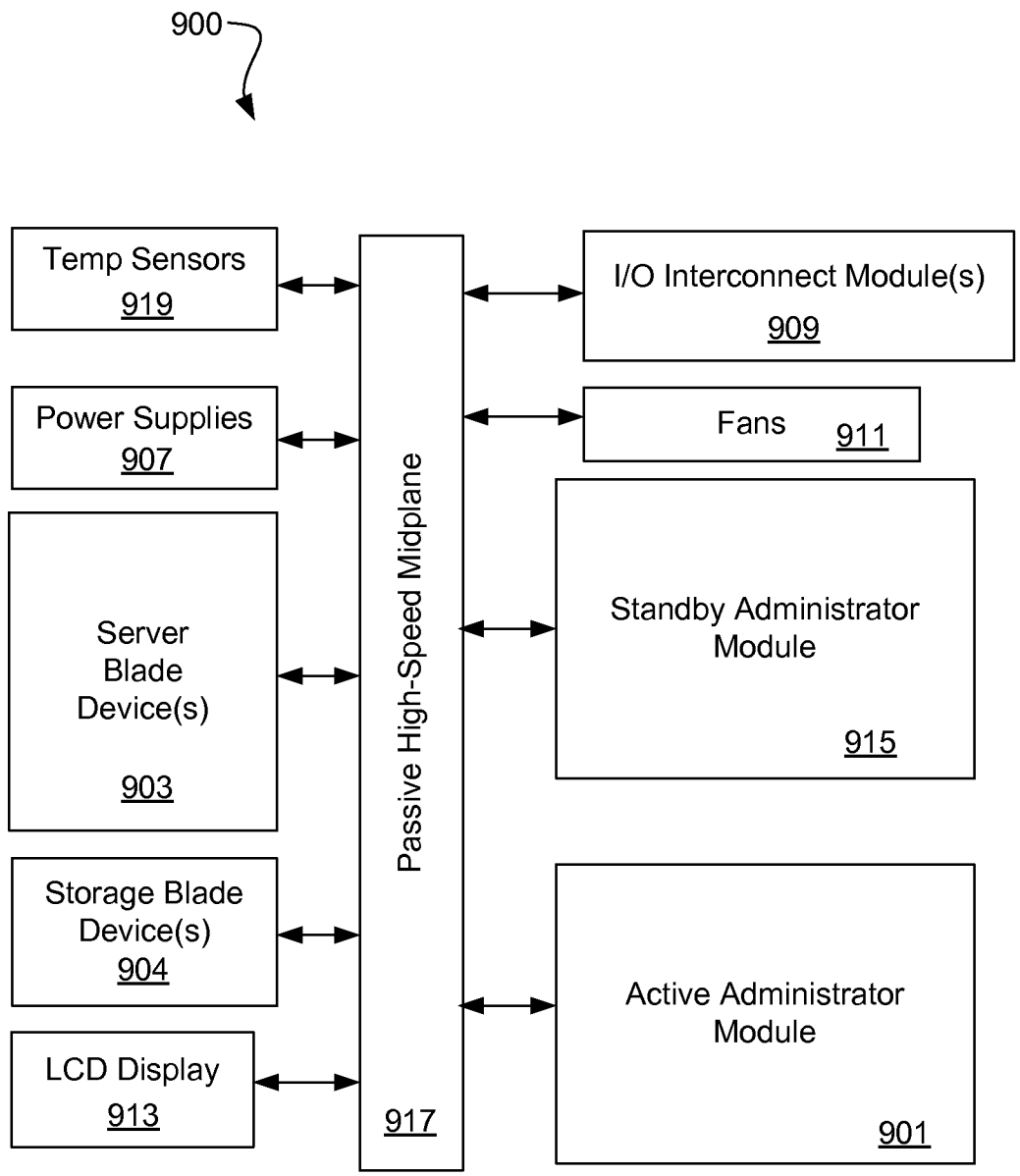
FIG. 9 is a block diagram of electronic components in an illustrative blade device enclosure, according to one embodiment of the principles described herein.

Referring now to FIG. 9, a block diagram of data communication in an illustrative blade device enclosure (900) is shown. In the blade device enclosure (900), an active administrator module (901) may be configured to control and manage at least one server blade device (903), at least one storage blade device (904), power supply devices (907), input/output interconnect modules (909), fans (911), and an LCD display (913). A standby administrator module (915) may be configured to perform all of these functions and be provided in addition to the active administrator module (901) for redundancy and resilience. Communication between the active administrator module (901) and these devices may be accomplished through mutual connections to a passive high-speed midplane (917) that may include one or more printed circuit boards. In the present example, communication signals between the active administrator module (901) and the standby administrator module (915) are routed on the same midplane (917). Alternatively, separate midplanes (917) may be used by each administrator module (901, 915) to provide redundancy and added system resilience.

The active administrator module (901) may provide at least four services for the entire enclosure: detection of component insertion and removal, identification of components (including required connectivity), management of power and cooling, and controlling components. In certain embodiments, the active administrator module (901) may be accessible to a user through a web-browser graphical user interface (GUI), a scriptable command line interface (CLI), and the LCD display (913) or other user interface housed in the chassis of the blade device enclosure (900) and accessible to a user.

When a new component, such as a server blade device (903) or a storage blade device (904) is inserted into the enclosure (100), the active administrator module (901) may detect the new component through presence signals available through the passive high-speed midplane (917). When this occurs, the active administrator module (901) may immediately recognize and identify the component, storing information about the component in memory. When the component is removed from the enclosure (100), the active administrator module (901) may delete information about the component from memory.

To identify a component, the active administrator module (901) may read a Field-Replaceable Unit (FRU) Electrically Erasable Programmable Read-Only Memory (EEPROM) module in the inserted component that contains specific factory information about the component such as, but not limited to, product name, part number, and serial number. In certain embodiments, all FRU EEPROMs may remain powered at all times, even if the component is turned off. In this way, the active administrator module (901) may identify the component prior to granting power to the component.

The active administrator module (901) may manage power control and thermal management among various components. The active administrator module (901) may be able to remotely control the power state of all components in the enclosure by communicating with devices such as microcontrollers in the components.

Thermal management may be used to minimize fan power consumption by reading temperature sensors (919) across the entire enclosure (100). Using data from the temperature sensors (919), the active administrator module (901) may then change fan speed in different zones of the enclosure (100) to minimize power consumption and maximize cooling efficiency.

The active administrator (901) may also use embedded management interfaces to provide detailed information and health status for each component housed in the enclosure (100). The active administrator module (901) may also offer information on firmware versions for components in the enclosure (100) and update the firmware in those components automatically.

Illustrative Method

Figure 10:
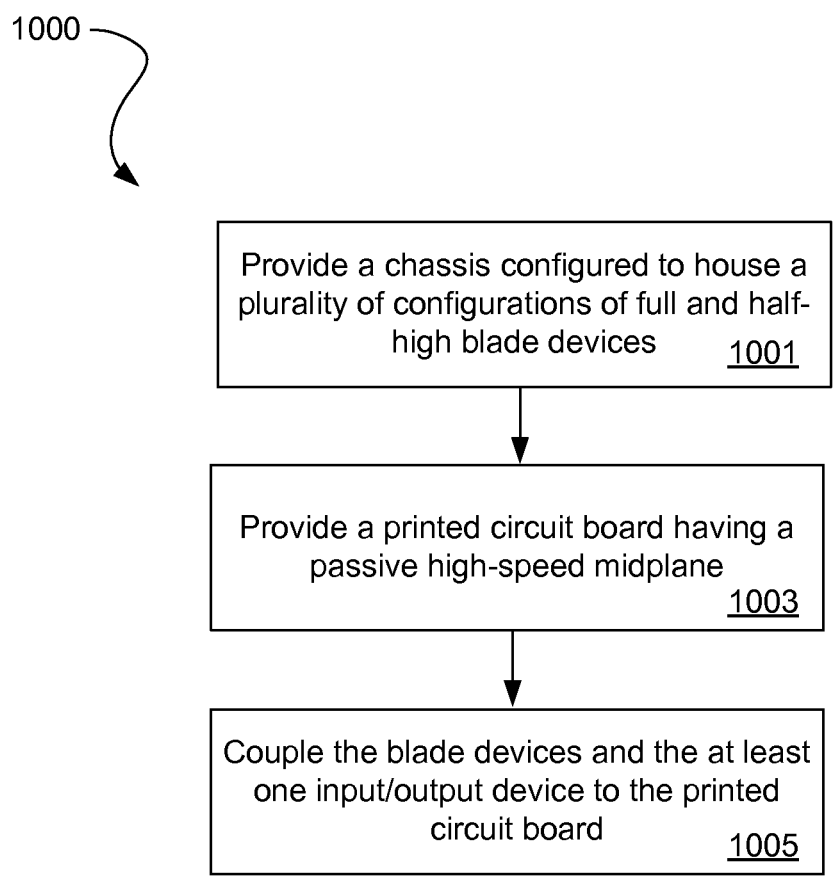
FIG. 10 is a block diagram of an illustrative method of coupling a plurality of blade devices to at least one I/O device according to one embodiment of the principles described herein.

Referring now to FIG. 10, a block diagram of an illustrative method (1000) of coupling a plurality of blade devices to at least one input/output device is shown. The method (1000) includes providing (step 1001) a chassis configured to house a plurality of configurations of full- and half-high blade devices. At least one printed circuit board having a passive high-speed midplane is then provided (step 1003). Blade devices disposed in the chassis and the at least one input/output device may then be coupled (step 1005) to the passive high-speed midplane. The blade device and the at least one input/output device may also be connected to at least one power supply in the chassis.

In certain embodiments, the method (1000) may include managing the blade devices and the at least one input/output device with an administrator module that is also coupled to the at least one printed circuit board. The administrator module may also provide information about the blade devices or the at least one input/output device to a user through a user interface housed in the chassis. In certain embodiments, the administrator module may also manage a temperature of the blade devices by selectively activating fans in the chassis.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A blade device enclosure, comprising:
   a chassis configured to selectively house a plurality of configurations of full-high and half-high blade devices, an administrator module, and at least one input/output device;
   a printed circuit board comprising a passive high-speed midplane configured to electronically couple said blade devices to said administrator module and said at least one input/output device; and
   a user interface display configured to slide axially between first and second positions so as to provide access to an interior of the chassis when said display is in said second position;
   wherein said administrator module is further configured to identify blade devices that are added to or removed from said enclosure.

2. The blade device enclosure of claim 1, further comprising at least one power supply in electrical communication with said blade devices, said administrator module, and said at least one input/output device.

3. The blade device enclosure of claim 1, wherein said chassis comprises a plurality of partitioning walls configured to form zones configured to house said blade devices.

4. The blade device enclosure of claim 1, wherein said chassis further comprises a plurality of horizontal partitioning walls configured to be selectively removable to increase a height of zones within the chassis.

5. The blade device enclosure of claim 1, wherein said zones are configured to house half-high blade devices when said partitioning walls remain in place and full-high blade devices when said partitioning walls are removed.

6. The blade device enclosure of claim 1, wherein said chassis comprises a plurality of fans configured to cool said blade devices, said administrator module, and said input/output devices.

7. The blade device enclosure of claim 1, further comprising a standby administrator module configured to backup said administrator module.

8. The blade device enclosure of claim 1, wherein said administrator module is configured to control said fans.

9. The blade device enclosure of claim 1, wherein said administrator module is configured to manage power supplied to said blade devices.

10. A blade device enclosure; comprising:
    a chassis configured to selectively house a plurality of configurations of full-high and half-high blade devices, at least one administrator module, and at least one input/output device;
    a user interface display configured to slide axially between first and second positions so as to provide access to an interior of the chassis when said display is in said second position;
    a printed circuit board comprising a passive high-speed midplane configured to electronically couple said blade devices to said administrator module and said at least one input/output device;
    a plurality of fans configured to cool said blade devices; and
    at least one power supply;
    wherein said administrator module is configured to control operations of said fans and coordinate communication between said blade devices and said at least one input/output device.

11. The blade device enclosure of claim 10, wherein said administrator module is further configured to identify blade devices that are added to or removed from said enclosure.

12. The blade device enclosure of claim 10, wherein said chassis comprises a plurality of partitioning walls for forming zones configured to house said blade devices.

13. The blade device enclosure of claim 12, wherein some of said partitioning walls are selectively removable to increase the height of said zones.

14. The blade device enclosure of claim 13, wherein said zones are configured to house half-high blade devices when particular partitioning walls remain in place and full-high blade devices when said particular partitioning walls are removed.

15. The blade device enclosure of claim 10, wherein said user interface display is configured to move so as to provide access to at least one power supply housing space in said chassis.

16. The blade device enclosure of claim 10, wherein said chassis is further configured to house a plurality of configurations of single-wide and double-wide input/output devices.

* * * * *